(12) United States Patent
Ghidoni et al.

(10) Patent No.: US 10,597,287 B2
(45) Date of Patent: *Mar. 24, 2020

(54) MULTI-CHAMBER TRANSDUCER MODULE, APPARATUS INCLUDING THE MULTI-CHAMBER TRANSDUCER MODULE AND METHOD OF MANUFACTURING THE MULTI-CHAMBER TRANSDUCER MODULE

(71) Applicant: STMICROELECTRONICS S.R.L., Agrate Brianza (IT)

(72) Inventors: Marco Omar Ghidoni, Melzo (IT); Roberto Brioschi, Sesto San Giovanni (IT)

(73) Assignee: STMICROELECTRONICS S.R.L., Agrate, Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,682

(22) Filed: Dec. 27, 2018

(65) Prior Publication Data

US 2019/0127218 A1    May 2, 2019

Related U.S. Application Data

(63) Continuation of application No. 15/362,556, filed on Nov. 28, 2016, now Pat. No. 10,189,703.

(30) Foreign Application Priority Data

Apr. 28, 2016    (IT) .......................... 102016000043408

(51) Int. Cl.
    *B81B 7/02*    (2006.01)
    *B81B 7/00*    (2006.01)
    (Continued)

(52) U.S. Cl.
    CPC .............. *B81B 7/02* (2013.01); *B81B 7/0061* (2013.01); *B81C 1/0023* (2013.01); *H04R 1/04* (2013.01);
    (Continued)

(58) Field of Classification Search
    CPC .......... H04R 19/04; H04R 1/04; H04R 1/406; H04R 3/005; H04R 19/005;
    (Continued)

(56) References Cited

U.S. PATENT DOCUMENTS

| 6,732,588 B1 | 5/2004 | Mullenborn et al. |
| 8,804,982 B2 | 8/2014 | Michel et al. |

(Continued)

FOREIGN PATENT DOCUMENTS

| CN | 104219611 A | 12/2014 |
| CN | 105307080 A | 2/2016 |

(Continued)

*Primary Examiner* — Davetta W Goins
*Assistant Examiner* — Kuassi A Ganmavo
(74) *Attorney, Agent, or Firm* — Seed Intellectual Property Law Group LLP (57) ABSTRACT

A transducer module, comprising: a supporting substrate, having a first side and a second side; a cap, which extends over the first side of the supporting substrate and defines therewith a first chamber and a second chamber internally isolated from one another; a first transducer in the first chamber; a second transducer in the second chamber; and a control chip, which extends at least partially in the first chamber and/or in the second chamber and is functionally coupled to the first and second transducers for receiving, in use, the signals transduced by the first and second transducers.

19 Claims, 7 Drawing Sheets

(51) Int. Cl.
  *B81C 1/00* (2006.01)
  *H04R 1/40* (2006.01)
  *H04R 1/04* (2006.01)
  *H04R 19/00* (2006.01)

(52) U.S. Cl.
  CPC ...... *H04R 1/406* (2013.01); *B81B 2201/0257* (2013.01); *B81B 2207/012* (2013.01); *B81B 2207/05* (2013.01); *B81B 2207/07* (2013.01); *B81B 2207/092* (2013.01); *B81B 2207/096* (2013.01); *H04R 19/005* (2013.01); *H04R 2201/003* (2013.01)

(58) Field of Classification Search
  CPC .... B81B 2201/0257; B81B 2201/0564; B81C 1/0023
  See application file for complete search history.

(56) References Cited

U.S. PATENT DOCUMENTS

| | | | |
|---|---|---|---|
| 8,861,764 | B2 | 10/2014 | Tanaka et al. |
| 8,958,592 | B2* | 2/2015 | Huang ............ H04R 1/08 181/144 |
| 9,301,033 | B2* | 3/2016 | Han ............ H04R 1/406 |
| 9,736,596 | B2 | 8/2017 | Kim et al. |
| 2003/0230798 | A1 | 12/2003 | Lin et al. |
| 2005/0127499 | A1* | 6/2005 | Harney ............ B81B 7/007 257/704 |
| 2008/0279407 | A1* | 11/2008 | Pahl ............ B81B 7/0064 381/355 |
| 2009/0020501 | A1* | 1/2009 | Tien ............ B81C 1/00309 216/17 |
| 2010/0303273 | A1 | 12/2010 | Sawada |
| 2011/0293126 | A1* | 12/2011 | Maekawa ............ H04R 19/005 381/355 |
| 2012/0057729 | A1 | 3/2012 | Rauscher |
| 2012/0250397 | A1 | 10/2012 | Ohmaru |
| 2012/0250897 | A1 | 10/2012 | Michel et al. |
| 2012/0288130 | A1 | 11/2012 | Dehe |
| 2013/0070951 | A1 | 3/2013 | Tanaka et al. |
| 2013/0156235 | A1 | 6/2013 | Wickstrom ............ H04R 19/04 381/174 |
| 2014/0003633 | A1 | 1/2014 | Liu |
| 2014/0084397 | A1* | 3/2014 | Ziglioli ............ B81B 3/0021 257/419 |
| 2014/0361387 | A1 | 12/2014 | Meyer et al. |
| 2015/0023523 | A1 | 1/2015 | Elian et al. |
| 2015/0061045 | A1 | 3/2015 | Fuergut et al. |
| 2015/0076630 | A1 | 3/2015 | Low et al. |
| 2016/0150325 | A1* | 5/2016 | Oliaei ............ H04R 1/406 381/111 |
| 2016/0345106 | A1* | 11/2016 | Pahl ............ H04R 19/04 |
| 2017/0013355 | A1* | 1/2017 | Kim ............ H04R 1/406 |

FOREIGN PATENT DOCUMENTS

| | | |
|---|---|---|
| EP | 2552127 A1 | 1/2013 |
| EP | 2810916 A2 | 12/2014 |
| WO | 2015106880 A1 | 7/2015 |

\* cited by examiner

MULTI-CHAMBER TRANSDUCER MODULE, APPARATUS INCLUDING THE MULTI-CHAMBER TRANSDUCER MODULE AND METHOD OF MANUFACTURING THE MULTI-CHAMBER TRANSDUCER MODULE

BACKGROUND

Technical Field

The present disclosure relates to a transducer module, an apparatus including the transducer module, and a method of manufacturing the transducer module.

Description of the Related Art

As is known, an acoustic transducer (in particular a microphone) of a MEMS (Micro-Electro-Mechanical System) type comprises a membrane sensitive structure, designed to transduce acoustic pressure waves into an electrical quantity (for example, a capacitive variation), and a reading electronics designed to carry out appropriate processing operations (amongst which amplification and filtering operations) on said electrical quantity for supplying an electrical output signal (for example, a voltage) representing the acoustic pressure wave received.

In the case where a capacitive sensing principle is used, the MEMS sensitive structure in general comprises a mobile electrode, provided as diaphragm or membrane, arranged facing a fixed electrode, to provide the plates of a sensing capacitor with variable capacitance. The mobile electrode is anchored, by a first portion thereof, which is generally perimetral, to a structural layer, whereas a second portion thereof, which is generally central, is free to move or bend in response to the pressure exerted by the incident acoustic pressure waves. The mobile electrode and the fixed electrode thus provide a capacitor, and bending of the membrane that constitutes the mobile electrode causes a variation of capacitance as a function of the acoustic signal to be detected.

A plurality of MEMS microphones are commonly mounted in multimedia electronic devices, such as smartphones. This is due to the fact that microphones are not only used for transducing the voice signal, but also for additional functions such as noise erasure and recording of sound, and each microphone may be dedicated to a specific function. Integration of a considerable number of microphones (e.g., from two to seven microphones) in an electronic device typically requires the use of dedicated integrated circuit boards and thus has a considerable impact on the occupation of space.

Further, according to the known art, each of the MEMS microphones is housed in a package that contains the transducer (e.g., a MEMS transducer) and the electronics for acquisition and pre-processing of the electrical signals generated by the transducer, typically an ASIC (Application-Specific Integrated Circuit). It is evident that this approach is not optimal from the standpoint of costs and of occupation of area.

The disadvantages of what has been set forth above may extend to MEMS devices other than microphones, for example to pressure sensors or UV sensors or other transducers that are typically present in consumer-electronics products.

BRIEF SUMMARY

One or more embodiments are directed to a transducer module, an apparatus including the transducer module, and a method of manufacturing the transducer module. One embodiment is directed to a transducer module comprising a supporting substrate having a first side and a second side and a cap coupled to the first side of the supporting substrate to form a first chamber and a second chamber. The second chamber is internally isolated from the first chamber. A first sensor chip is coupled to the first side of the supporting substrate in the first chamber. The first sensor chip integrates a first MEMS transducer configured to detect a first environmental quantity and to generate a first transduced signal as a function of the first environmental quantity detected. A second sensor chip is coupled to the first side of the supporting substrate in the second chamber. The second sensor chip integrates a second MEMS transducer configured to detect a second environmental quantity and to generate a second transduced signal as a function of the second environmental quantity detected. A control chip is at least partially exposed in at least one of the first chamber and in the second chamber. The control chip is functionally coupled to the first and second MEMS transducers and configured to receive, in use, the first and the second transduced signals.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Illustrated with reference to FIG. 1, in a system of spatial co-ordinates x, y, and z, is a transducer module 10 of a type with multiple chambers that are designed to house respective devices. The transducer module 10 comprises a substrate 23 arranged on which is a cap 27 defining a first cavity (or chamber) 8 and a second cavity (or chamber) 18 internally isolated from one another. The first and second cavities 8, 18 are both defined between a top surface 23a of the substrate 23 and an inner surface 27a of the cap 27, and are separated from one another by a separation wall 11, which extends continuously between the inner surface 27a of the cap 27 and the top surface 23a of the substrate 23, completely separating the first and second cavities 8, 18 from one another. In one embodiment, the substrate 23 is a substrate of an LGA (Land-Grid Array) type. In an alternative embodiment, the substrate 23 is made of semiconductor material (e.g., silicon), obtained by known micromachining processes. The cap 27 may be made of pre-molded plastic or metal material and may have, for example, the inner surface 27a coated with a metal layer in order to provide an electromagnetic shield.

The cap 27 is coupled to the substrate 23 by coupling regions 24 (solder regions, or regions of glue, or any other suitable adhesive material). The substrate 23 and the cap 27 form a package 20.

A first sensor chip 21 is housed in the first cavity 8 and integrates a MEMS structure, which provides a first transducer 1, in particular, according to one embodiment of the present disclosure, an acoustic transducer. The first acoustic transducer 1 may be manufactured according to any technology available and may operate according to any known operating principle. By way of example, the first acoustic transducer 1 is provided with a membrane 2, which is mobile and is made of conductive material, facing a rigid plate 3 (by this term is here understood an element that is relatively rigid as compared to the membrane 2, which is, instead, flexible). The rigid plate 3 includes at least one conductive layer facing the membrane 2, so that the membrane 2 and the rigid plate 3 form facing plates of a capacitor. The membrane 2, which in use undergoes deformation as a function of incident acoustic pressure waves, is at least partially suspended over a structural layer 5 and directly faces a cavity 6, obtained by forming a trench in a region corresponding to a rear surface 5b of the structural layer 5 (the rear portion 5b is opposite to a front surface 5a of the structural layer 5 itself, arranged in the proximity of the membrane 2).

The first inner cavity 8 likewise houses a second chip (control chip) 22 integrating a processing circuit, or ASIC 22'. The ASIC 22', which is per se known, comprises signal-processing circuits (for example, a charge-amplifier circuit for a capacitive electroacoustic sensor) and/or the components for enabling proper operation of the acoustic transducer 1, in particular as regards the electrical/electronic functions of transduction of the acoustic signals. The ASIC 22' is electrically coupled to the first acoustic transducer 1 by an electrical conductor 25' (with the wire-bonding technique), which connects together respective pads 26a and 26b of the first and second chips 21, 22. Further electrical connections 25", for example, obtained with the wire-bonding technique, are provided for coupling one or more pads 26c of the control chip 22 to respective pads 26d of the substrate 23.

The first and second chips 21, 22 are coupled side-by-side on a substrate 23 of the package 20. The sensor chip 21 is coupled to the substrate 23 on the rear surface 5b of the structural layer 5, for example by an adhesive layer or a layer of glue. Likewise, also the control chip 22 is coupled to the substrate 23 on a rear surface 22b thereof, for example by a solder mask (not shown). Other modalities for coupling of the first and second chips 21, 22 to the substrate 23 may be envisaged, according to the specifications.

The ASIC 22' is provided on a front surface 22a of the control chip 22, opposite to the rear surface 22b. Appropriate metallization layers and/or conductive through vias (an electrical path 30 is illustrated in FIG. 1) are provided in the substrate 23 for routing electrical signals from the inside of the first cavity 8 towards the outside of the package 20.

Electrical-connection elements 29a, for example in the form of conductive lands, are provided on an underside 23b of the substrate 23 (the side exposed outwards), for bonding and electrical connection to a printed-circuit board (PCB), and/or for testing operations. A further solder mask 19 may be applied on an underside 23b of the substrate 23.

According to one aspect of the present disclosure, throughout the thickness of the base substrate 23 a through opening, or hole, 28, is made, designed to arrange, in acoustic communication, the cavity 6 of the first chip 21 with the environment external to the package 20. In what follows, the through opening 28 will also be referred to as a "sound port", and the cavity 6 of the first chip 21 will also be referred to as "acoustic chamber".

The extension (in the horizontal plane xy) of the acoustic chamber 6 is greater than the corresponding extension (once again in the horizontal plane xy) of the sound port 28, so that the sound port 28 communicates entirely with the acoustic chamber 6 without it having a direct outlet towards the internal space 8 of the package 20.

The second cavity 18 houses a MEMS structure integrated in a third chip (sensor chip) 41, forming a second acoustic transducer 42, but, unlike the first cavity 8, does not present a further chip (control chip) integrating a processing circuit (ASIC).

The MEMS structure housed by the sensor chip 41 is provided with a membrane 43, which is mobile and is made of conductive material, facing a rigid plate 44 (by this term is here meant an element that is relatively rigid as compared to the membrane 43, which is, instead, flexible). The rigid plate 44 includes at least one conductive layer facing the membrane 43 so that the membrane 43 and the rigid plate 44 form facing plates of a capacitor.

The membrane 43, which in use undergoes deformation as a function of incident acoustic pressure waves, is at least partially suspended over a structural layer 45 and directly faces a cavity 46, obtained by etching in an area corresponding to a rear surface 45b of the structural layer 45 (the rear portion 45b is opposite to a front portion 45a of the structural layer 45 itself, arranged in the proximity of the membrane 43).

The sensor chip 41 is coupled to the top surface 23a of the substrate 23 via the rear surface 45b of the structural layer 45, for example by an adhesive layer (not illustrated).

Appropriate metallization layers and/or through vias (one electrical path 51 is illustrated by way of example) are provided in the substrate 23 for routing the electrical signals from inside the second cavity 18 towards the outside of the package 20. One or more electrical connections 55, obtained with the wire-bonding technique, are provided for coupling one or more pads 56a of the sensor chip 41 to respective pads 56b of the substrate 23.

Further electrical-connection elements 29b are provided on the underside 23b of the substrate 23, for bonding and electrical connection to a printed circuit, and/or for testing operations. The electrical-connection elements 29b are electrically coupled to the pads 56b by respective electrical paths 51 through the substrate 23.

Throughout the thickness of the cap 27, only in a position corresponding to the second cavity 18, a through opening, or hole, 59 is provided, designed to arranged in acoustic communication the second cavity 18 with the environment external to the package 20. The through opening 59 forms a sound port of the second acoustic transducer 42.

Figure 1:
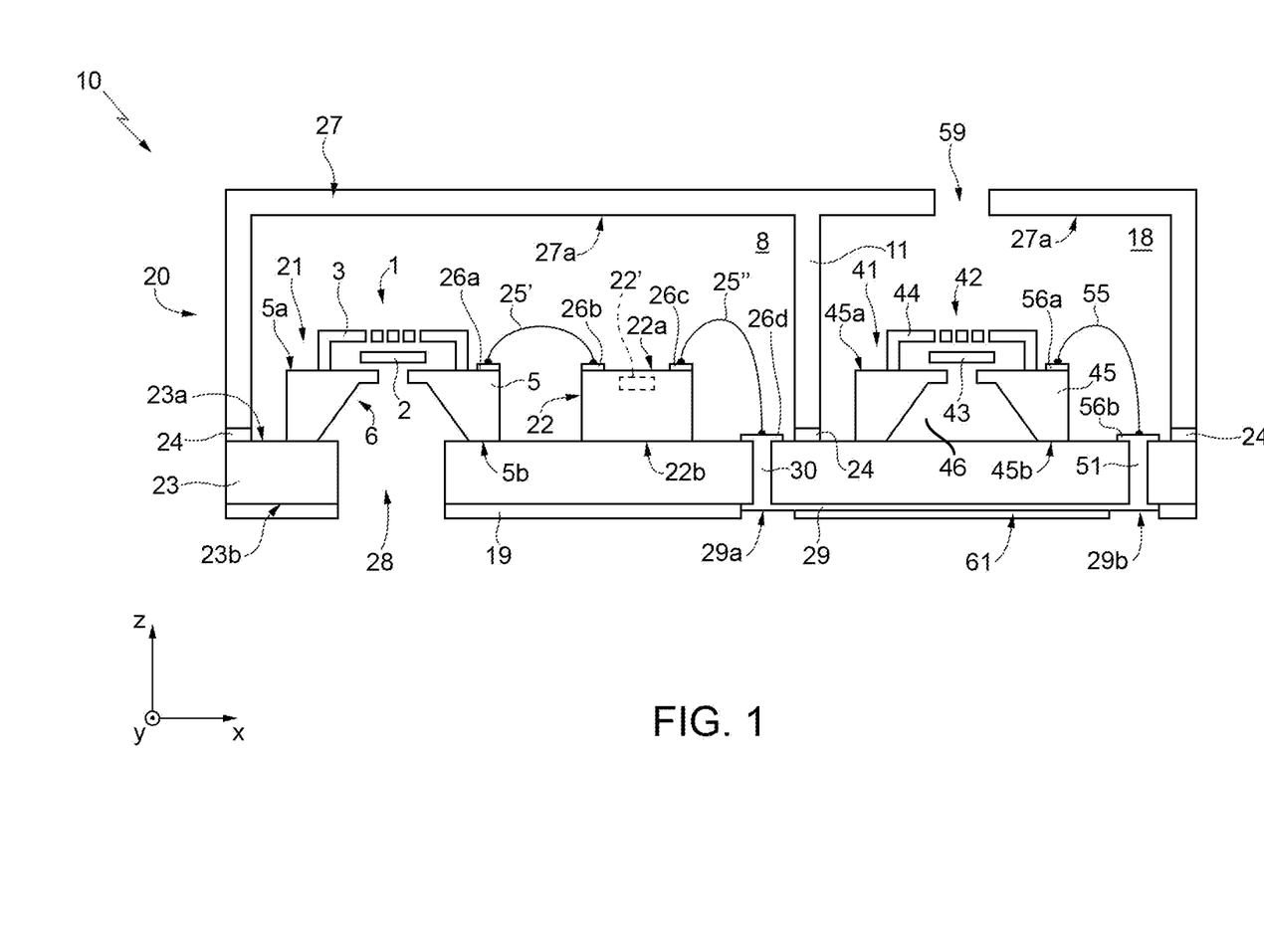
FIGS. 1-6 are views in lateral section of respective multi-chamber and multi-device transducer modules according to respective embodiments of the present disclosure.

Thus, according to the embodiment of FIG. 1, the sound port 28 of the first acoustic transducer 1 and the sound port 59 of the second acoustic transducer 42 extend on mutually opposite sides of the package 20.

According to one aspect of the present disclosure, the electrical connection element 29a and the electrical connection element 29b form part of, or are coupled to, a conductive path 29, which extends on the bottom surface 23b of the substrate 23 and electrically connects the conductive via 30 with the conductive via 51. Thus, the electrical-connection wire 25", the through via 30, the conductive path 29, the through via 51, and the electrical-connection wire 55 form an electrical conductive path 61, which functionally couples the control chip 22 (and in particular the ASIC 22') to the sensor chip 41 (and in particular the second acoustic transducer 42).

In this way, the electrical signal generated at output by the second acoustic transducer 42 (transduced acoustic signal) is sent to the ASIC 22', for the signal-processing steps, through the electrical conductive path 61. This embodiment enables formation of a structure of transducers that share the same ASIC, with considerable savings in terms of costs and of space occupied. The arrangement of the respective sound ports 28, 59 is such that one sound port (e.g., the sound port 28) may be used for acquisition of a sound signal (e.g., a voice signal), whereas the other sound port (here, the sound port 59) may be used for acquisition of environmental noise. Both of the signals transduced by the respective acoustic transducers 1, 42 are sent to the ASIC 22', which processes them and, in this example, carries out erasure of the background noise present in the signal acquired via the sound port 28.

According to a different embodiment (illustrated in FIG. 2), a transducer module 10' comprises an electrical conductive path 61', which electrically connects the first and second cavities 8, 18 and is of a type buried in the substrate 102, i.e., formed inside the core 117. In this case, through vias 30', 51' terminate inside the core 117, and a conductive path 29', which connects the through vias 30', 51' to one another, is a conductive path buried in the core 117.

According to a different embodiment, not illustrated in the figures, the electrical conductive path that electrically connects the first and second cavities extends over the top surface of the substrate, facing the inside of the chambers 8, 18. In this case, said electrical path that extends over the substrate is covered by a solder mask, of insulating material, and thus is electrically insulated from the cap.

Figure 2:
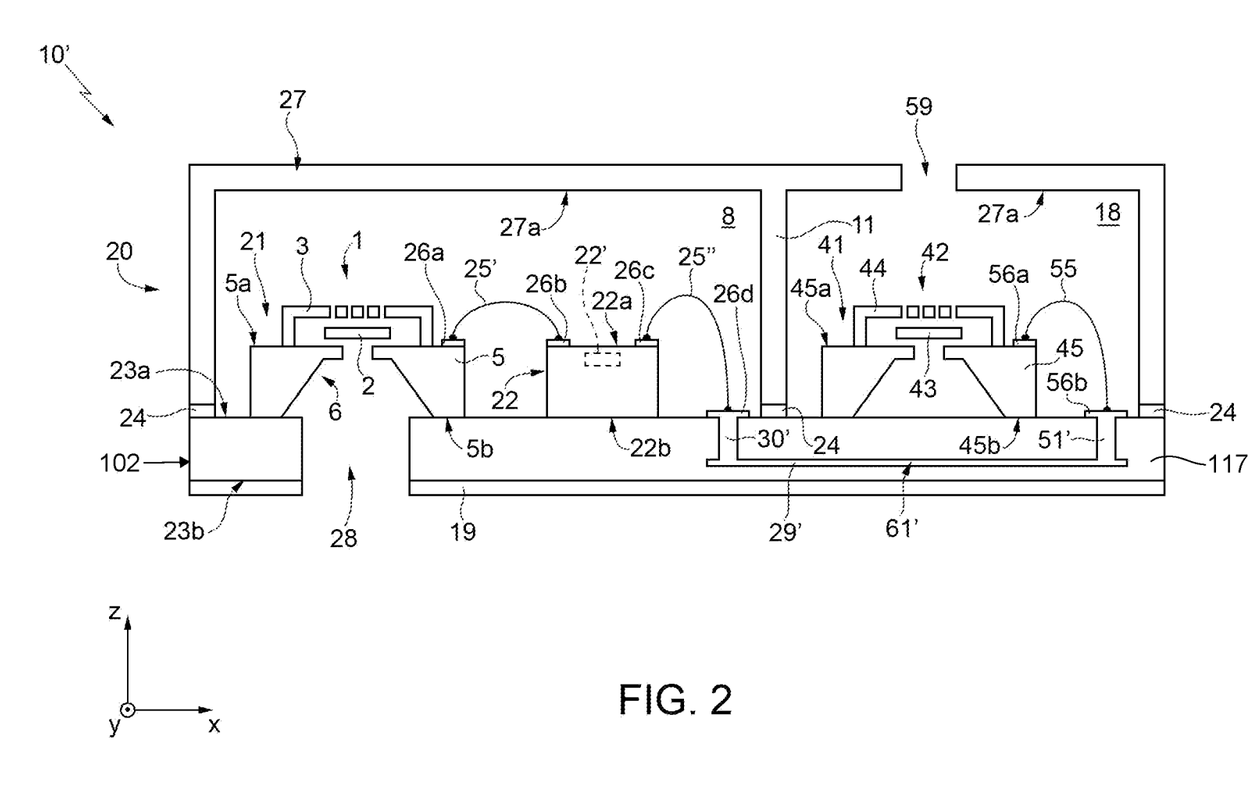
Figure 3:
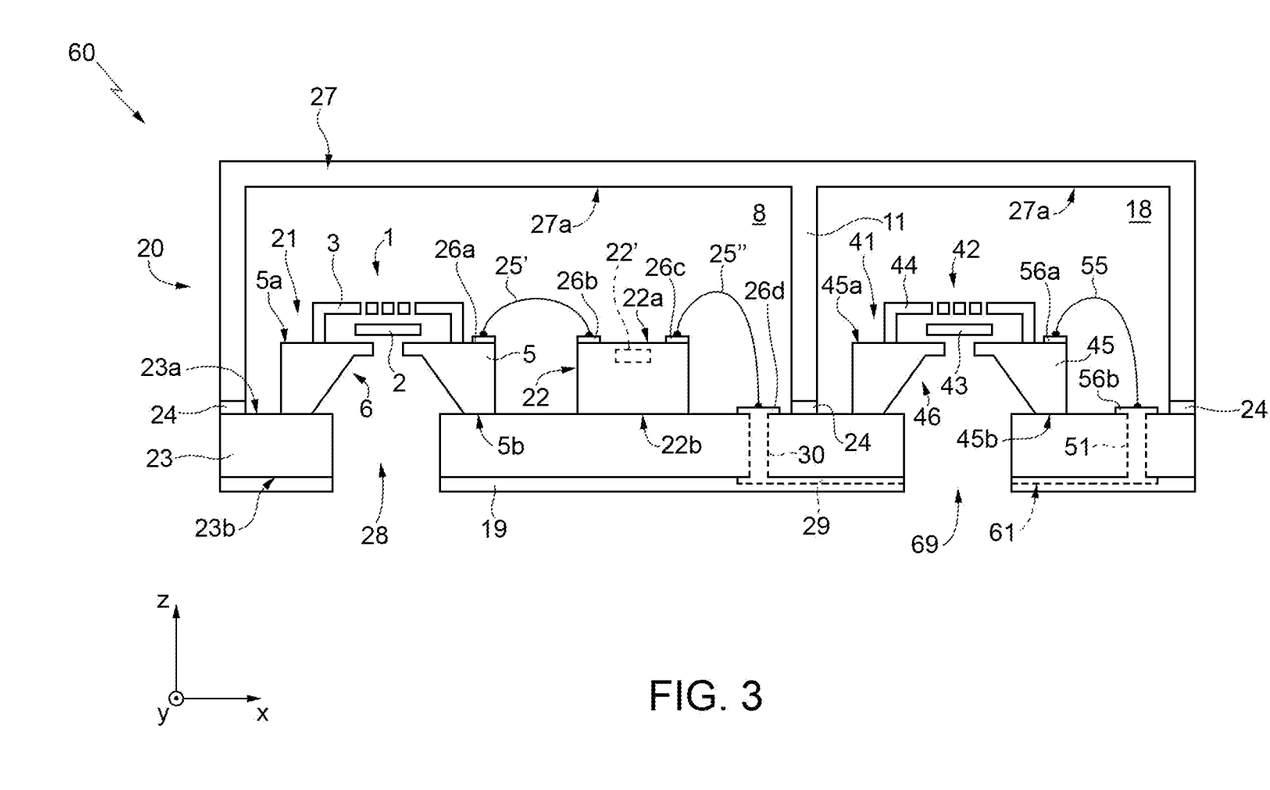

According to a further embodiment of the present disclosure, FIG. 3 shows a transducer module 60, of a multi-chamber type, in which the sound port 59 through the cap 27 is not present, as is instead illustrated in FIG. 1. Elements that are common to the transducer module 10' of FIG. 2 and to the transducer module 10 of FIG. 1 are designated by the same reference numbers and are not described any further.

According to the embodiment of FIG. 3, a sound port 69 of the second acoustic transducer 42 is obtained through the substrate 23, as envisaged for the first acoustic transducer 1. For this purpose, a through opening, or hole, designed to arrange, in acoustic communication, the cavity 46 of the sensor chip 41 with the environment external to the package 20, is provided through the substrate 23. The through opening forms the sound port 69 of the acoustic transducer integrated in the sensor chip 41. The extension (in the horizontal plane xy) of the acoustic chamber 46 is greater than the corresponding extension (once again in the horizontal plane xy) of the sound port 69, so that the sound port 69 communicates entirely with the acoustic chamber 46 without having a direct outlet towards the second cavity 18 (and, obviously, not even towards the first cavity 8) of the package 20.

In FIG. 3, the conductive path 61 that arranges, in electrical communication, the ASIC 22' with the second acoustic transducer 42 is represented with a dashed line, in so far as it extends in a region of the substrate 23 that does not present the through opening of the sound port 69, and is not visible in the cross-section of FIG. 3. It is evident that the variant described with reference to FIG. 2 applies also to the embodiment of FIG. 3.

Further variants are likewise possible. For instance, both of the sound ports of the first and second acoustic transducers may be provided at the cap 27. In this case, the sound port of the first acoustic transducer 1 forms an acoustic connection between the environment external to the package 20 and the first cavity 8, whereas the sound port of the second acoustic transducer 42 forms an acoustic connection between the environment external to the package 20 and the second cavity 18.

Providing both of the sound ports through the covering element 27 enables mounting of the multi-device transducer module on a PCB through the substrate 23.

According to further variants of the present disclosure, at least one between the first and second acoustic transducers 1, 42 of FIGS. 1-3 may be replaced by a transducer of a different type, for example chosen in the group comprising: a pressure sensor (transducer), a UV sensor, an IR sensor, a generic light-signal sensor (e.g., a photodiode), an accelerometer, or a gyroscope. Also in this case, only one between the first and second cavities 8, 18 houses the control chip 22, in so far as transmission of the transduced signals from the transducer housed in the other cavity 8, 18 to the ASIC 22' is obtained via the electrical path 61.

It is evident that in the case of use of a non-acoustic transducer (e.g., a UV or IR transducer), the through opening 59 does not have the function of sound port, and is configured to form an inlet for the incident light radiation on a sensitive area of the respective transducer.

Figure 4:
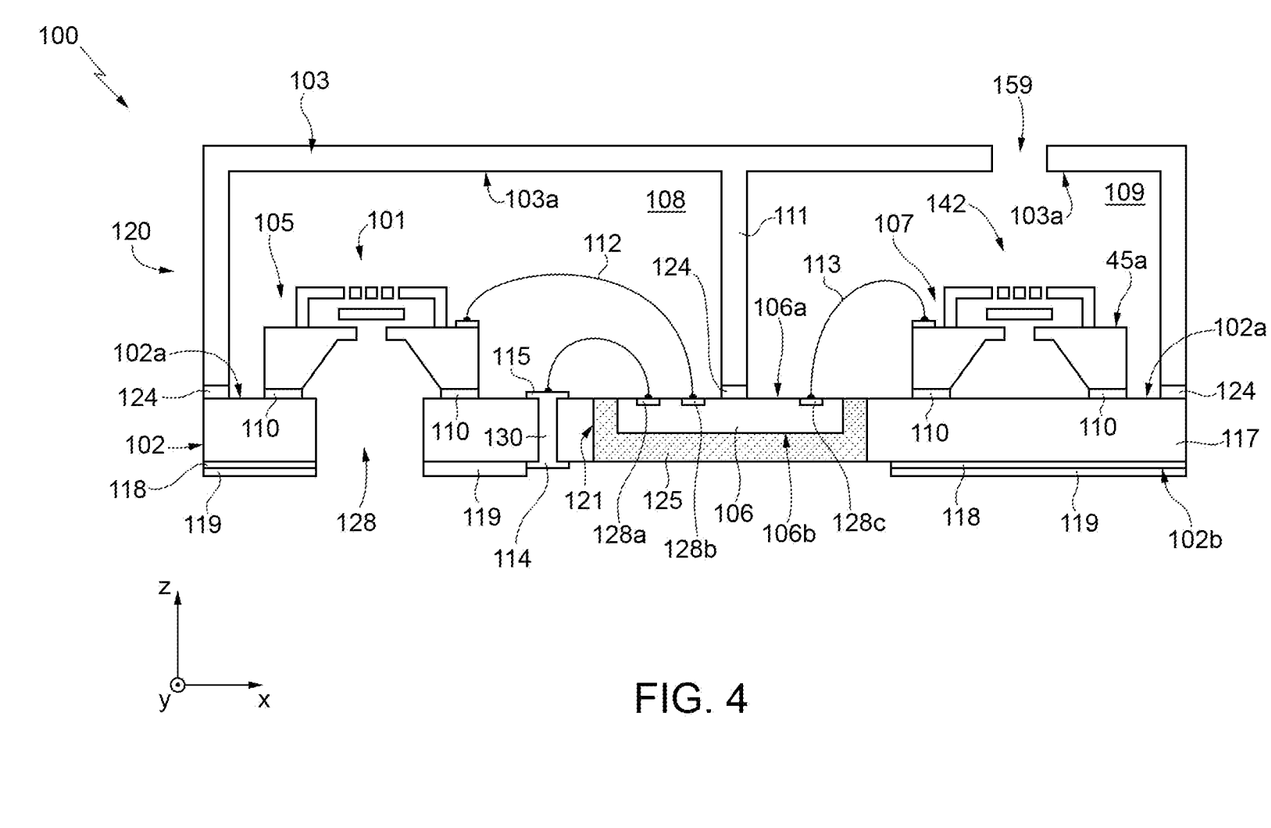

FIG. 4 illustrates, in a system of spatial co-ordinates x, y, and z, a transducer module 100, of a multi-chamber type, according to a further embodiment of the present disclosure.

The transducer module 100 comprises a supporting substrate 102, arranged on which is a cap 103, which defines, with the substrate 102, a first cavity (or chamber) 108 and a second cavity (or chamber) 109, which are internally isolated from one another. The first and second cavities 108, 109 both extend between a top surface 102a of the substrate 102 and an inner surface 103a of the cap 103, and are completely separated from one another by a separation wall 111.

The first cavity 108 houses a first sensor chip 105, which integrates a first transducer 101, here in particular of an acoustic type, whereas the second cavity 109 houses a second sensor chip 107, which integrates a second transducer 142, here in particular of an acoustic type.

A control chip 106 extends in the substrate 102, as described more fully hereinafter, and is operatively coupled to the first and second sensor chips 105, 107 by bonding wires 112 and 113, respectively (wire-bonding technique). More in particular, at least one between the first and second sensor chips 105, 107 is directly connected to the control chip 106.

The first and second acoustic transducers 101, 142 are of a per se known type, and in particular of the type already described with reference to FIG. 1. For instance, in one embodiment, each of them comprises a membrane of semiconductor material, laid over a cavity formed in the body of the respective sensor chip 105, 107, and a rigid metal backplate capacitively coupled to the membrane. The backplate is, for example, provided with holes and is arranged facing the membrane.

The substrate 102 and the cap 103 are joined together and form a package structure 120, which houses and protects the first and second sensor chips 105, 107 and the control chip 106.

According to one embodiment, the cap 103, in addition to having the protective function, further defines an acoustic chamber of the first and second acoustic transducers 101, 142.

In one embodiment, the substrate 102 may be a substrate of an LGA type and comprises a core 117. One or more respective outer metal layers 118 and inner metal layers 110, for example of copper, extend over opposite faces of the core 117. A solder mask may likewise be present, in a per se known manner, to form a coupling region between the first sensor chip 105 and the substrate 102, and between the second sensor chip 107 and the substrate 102.

The core 117 is defined by a chip of rigid dielectric material, for example FR4. The outer metal layer 118 extends over a face of the core 117 external to the cavities 108, 109, i.e., opposite to the cap 103. In the outer metal layer 118 external contacts 114 are defined for electrical connection of the MEMS microphone 1. A solder mask 119 may be applied partially over the outer metal layer, leaving the contacts 114 free.

The inner metal layer 110 is arranged on an inner face of the core 117, closed by the cap 103. Defined in the inner metal layer 110 are internal contacts 115.

A through hole made through the substrate 102 defines a sound port 128 of the first acoustic transducer and enables acoustic coupling of the inside of the first cavity 108 housing the first sensor chip 105 with the environment external to the package 120.

A through hole made through the cap 103 defines a sound port 159 of the second acoustic transducer and enables acoustic coupling of the inside of the second cavity 109 housing the second sensor chip 107 with the environment external to the package 120.

A recess in the substrate 102 defines a housing 121 in which the control chip 106 is, at least partially, housed.

An adhesion region 124 extends along the perimeter of the core 117 and is formed, for example, by an adhesive layer such as glue or a solder paste, or else by portions of the inner metal layer 110, and forms a region for coupling the cap 103 to the substrate 102. The adhesion region 124 likewise extends along surface portions of the control chip 106 and forms a further region 124 for coupling (mechanical coupling) between the separation wall 111 and selective portions of the control chip 106.

The cap 103 is thus fixed to the substrate 102 via the adhesion region 124. The internal contacts 115 are electrically coupled to respective external contacts 114 by through vias 130, which extend through the core 117.

Even though FIG. 4 illustrates just one internal contact 115 and just one through via 130 at the first cavity 108, it is evident that the internal contacts and through vias through the core 117 may be of any number, chosen according to the specifications, both for the first cavity 108 and for the second cavity 109.

The control chip 106 houses an integrated control circuit or ASIC, not illustrated in detail, which comprises signal-processing stages (for example, a charge-amplifier circuit for a capacitive electroacoustic sensor) and the components for enabling proper operation of the microphone, in particular as regards transduction of the acoustic signals.

As has been said, the control chip 106 is located within the housing 121. Further, the control chip 106 has a thickness less than the thickness of the substrate 102 and is contained in a region delimited by an inner face 102a and an outer face 102b of the substrate 102. Further, the control chip 106 has an inner face 106a aligned (coplanar) to the inner face 102a of the substrate 102. The face 106b, opposite to the face 106a, of the control chip does not reach the outer face 102b of the substrate 102.

According to one embodiment (not illustrated), the control chip 106 has the inner face 106a and the outer face 106b aligned, respectively, to an inner face 102a and an outer face 102b of the substrate 102 (or of the core 117).

Possibly, the control chip 106 may undergo a machining or chemico-mechanical surface treatment in order to adapt the thickness to the depth of the housing 121 and/or in order to obtain a good alignment between the face 106a of the control chip 106 and the face 102b of the substrate 102.

With reference to FIG. 4, the control chip 106 is connected to the substrate 102 and withheld within the housing 121 by a fixing frame 125, which occupies the space between the control chip 106 and the walls that delimit the housing 121. The fixing structure 125 is cup-shaped and covers lateral and bottom regions of the control chip 106, leaving free exclusively the top face 106a, facing the cap 103 and accessible from inside the cavities 108, 109. The bottom of the fixing structure 125 is aligned to the outer face 102b of the substrate 102.

The fixing structure 125 may, for example, be obtained by molding of polymeric material, for instance according to a film-assisted molding technique or with the pin-gate-molding technique. The control chip 106 is arranged in the housing 121 by a pick-and-place operation and withheld therein, for example, by an adhesive medium, or glue, previously laid on the control chip or on the fixing structure 125, or by any other bonding system.

To favor production of the fixing structure 125 by molding techniques, a portion of the inner metal layer 110 may extend along the sides of the housing 121, defining the perimeter thereof.

On the inner face 106a, the control chip 106 has contact pads 128a-128c. The contact pad 128a is used to set up an electrical connection with the contact pad 115 and is thus accessible from outside the package 120 through the contact pad 114 and the through via 130; the contact pad 128b is used to set up an electrical connection with the first sensor chip 105, by the bonding wire 112; finally, the pad 128c is used to set up an electrical connection with the second sensor chip 107, by the bonding wire 113.

As an alternative to the connection by bonding wires 112, 113, one or both of the first and second sensor chips 105, 107 is/are partially arranged on top of the control chip 106. Fixing is obtained by an adhesive layer, for example a glue or a solder paste.

Given the same dimensions, the fact that the sensor chip 105, 107 is arranged on top of the control chip 106 enables reduction of the overall area occupied, without increasing the total thickness of the package 120. Vice versa, given the same area occupied, the sensor chips 105, 107 and/or the control chip 106 may have larger dimensions, to the advantage of performance.

Figure 5:
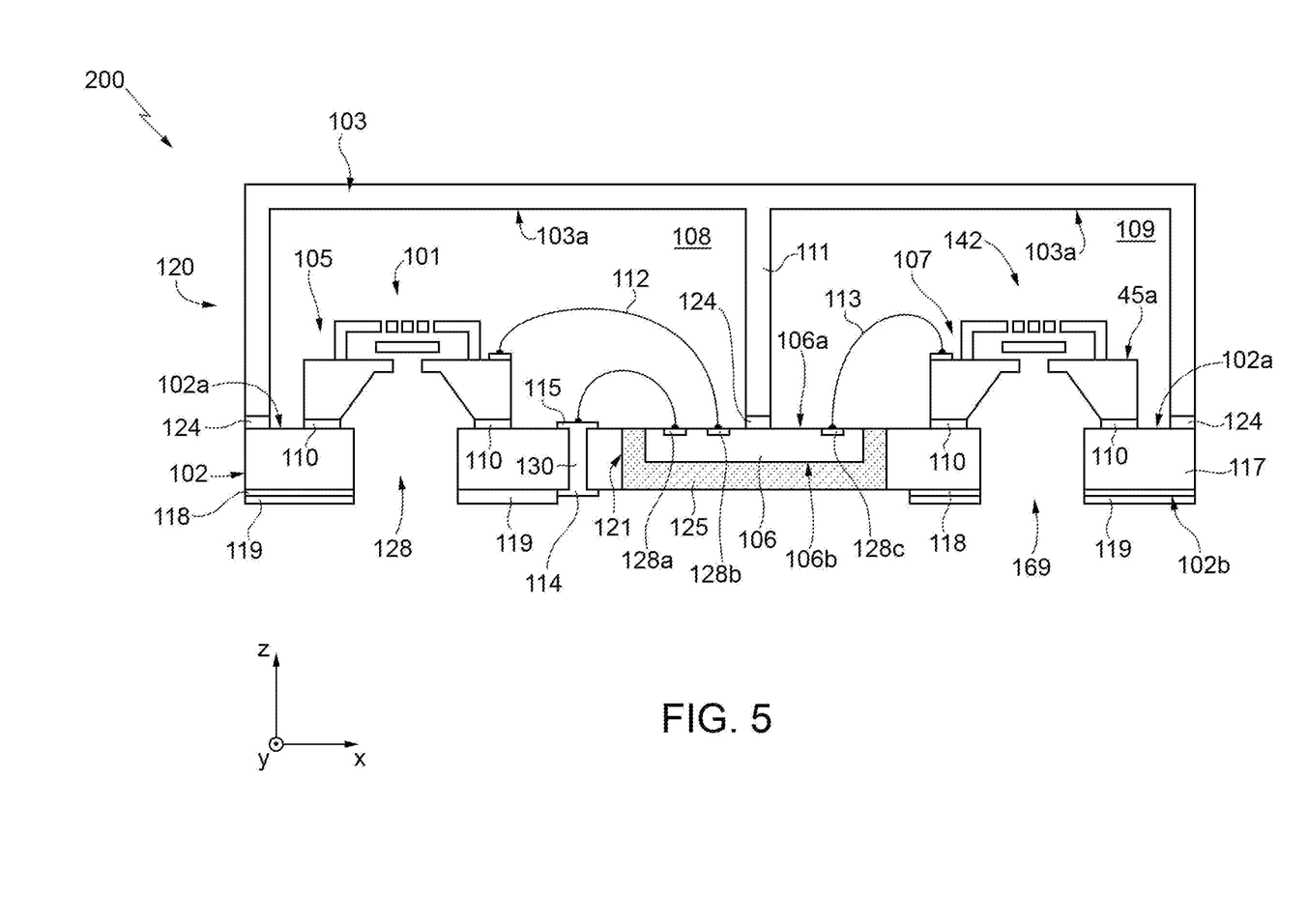

According to a further embodiment of the present disclosure, FIG. 5 shows a transducer module 200 that is similar to the transducer module 100 but does not have the sound port 159 through the cap 103, as is instead shown in FIG. 4. Elements that are in common with those of the transducer module 200 of FIG. 5 and of the transducer module 100 of FIG. 4 are designated by the same reference numbers and are not described any further.

According to the embodiment of FIG. 5, a sound port 169 of the second acoustic transducer is provided through the substrate 102, as envisaged for the first acoustic transducer and as described for the embodiment of FIG. 3.

It is evident that further variants are possible. For instance, in a way not illustrated in the figure, both of the sound ports of the first and second acoustic transducers of FIG. 4 may be provided in the cap 103. In this case, the sound port of the first acoustic transducer 101 forms an acoustic connection between the environment external to the package 120 and the first cavity 108, whereas the sound port of the second acoustic transducer 142 forms an acoustic connection between the environment external to the package 120 and the second cavity 109.

Providing both of the sound ports through the cap 103 enables mounting of the multi-device transducer module thus obtained on a PCB with the underside 102b of the substrate 102 in contact with the PCB.

According to what has been described, the transducer modules 100 and 200 of FIGS. 4 and 5 envisage the use of a control chip 106 shared by both of the acoustic transducers integrated in the sensor chips 105, 107 and electrically accessible by both of the cavities 108, 109.

The signals transduced by both of the first and second transducers 101, 142 are sent to the control chip 106, which processes them in a per se known manner that does not form the subject of the present disclosure. In this way, it is not necessary to provide a dedicated ASIC in both of the cavities 108, 109 in so far as the ASIC integrated in the control chip 106 is shared by both of the acoustic transducers 101, 142 integrated in the sensor chips 105, 107, with considerable savings in costs and physical space desired.

Likewise, according to further variants of the present disclosure, one of the two acoustic transducers 101, 142 described with reference to FIGS. 4 and 5 may be replaced by a transducer of a different type, for example chosen in the group comprising: a pressure sensor (transducer), a UV sensor, an IR sensor, a generic light-signal sensor (e.g., a photodiode), an accelerometer, or a gyroscope.

According to a further embodiment of the present disclosure, it is possible to form multi-chamber transducer modules in which the package defines any number of internal cavities (chambers), similar to the cavities 108 and 109 described previously. Each cavity may house a respective transducer (e.g., acoustic transducer, pressure transducer, UV transducer, IR transducer, etc.), and said transducers share a same control chip, or ASIC, and are functionally coupled to the latter according to the embodiments described previously, or a combination thereof.

Figure 6:
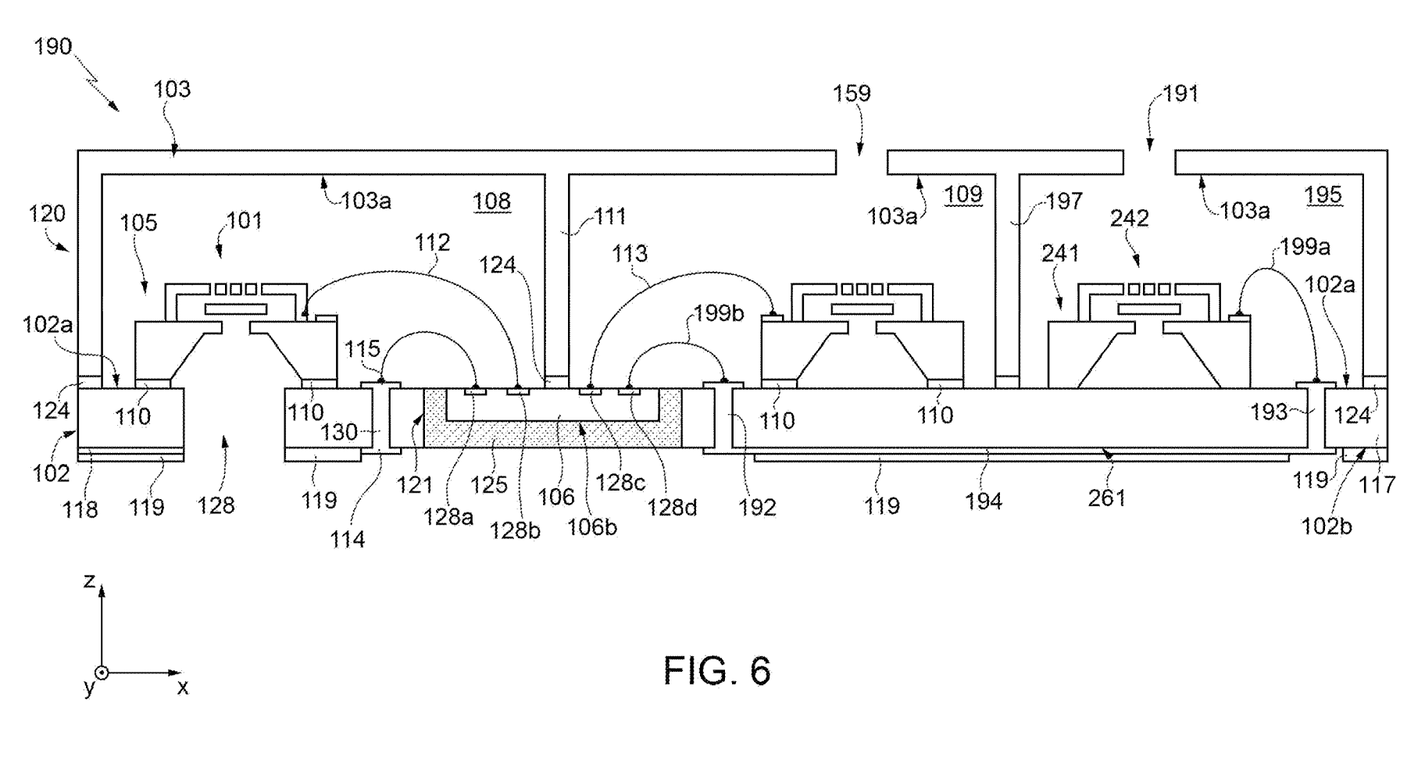

By way of example, FIG. 6 shows a transducer module 190 provided with three inner cavities (chambers). In particular, the transducer module 190 is based upon the transducer module 100 described with reference to FIG. 4 and further has a further third cavity 195 defined between the substrate 102 and the cap 103, separated from the second cavity 109 by a wall 197, which extends between the cap 103 and the substrate 102, like the wall 111 described previously. The third cavity 195 houses a third sensor chip 241, which integrates an acoustic transducer 242 similar to the acoustic transducer 42 described with reference to FIGS. 1-3, and thus not described any further herein. A sound port 191 of the acoustic transducer 42 is provided through the cap 103. However, it is evident that it may alternatively be provided through the substrate 102.

A conductive path 261 enables electrical connection of the acoustic transducer 242 with the control chip 106, for supplying to the control chip 106 the electrical signal transduced, in use, by the acoustic transducer 242. Said conductive path 261 is provided in a way similar to what has been described with reference to the conductive path 61 of FIGS. 1-3. For instance, the conductive path 261 includes: a through via 193, which defines an electrical connection throughout the thickness of the substrate 102, from the surface 102a internal to the third cavity 195 as far as the outer surface 102b; a through via 192, which defines an electrical connection throughout the thickness of the substrate 102, from the surface 102a internal to the second cavity 109 as far as the outer surface 102b; a conductive path 194, which extends over the surface 102b of the substrate 102, between the through via 192 and the through via 193, in electrical connection with both; bonding wires 199a, 199b (inside the third cavity 195 and second cavity 109, respectively), which connect, respectively, electrical contact pads of the acoustic transducer 242 to the through via 193, and the through via 192 to an electrical contact pad 128d of the control chip 106. In this way, the control chip 106 may receive the signal transduced by the acoustic transducer 242, for subsequent processing steps.

Figure 7:
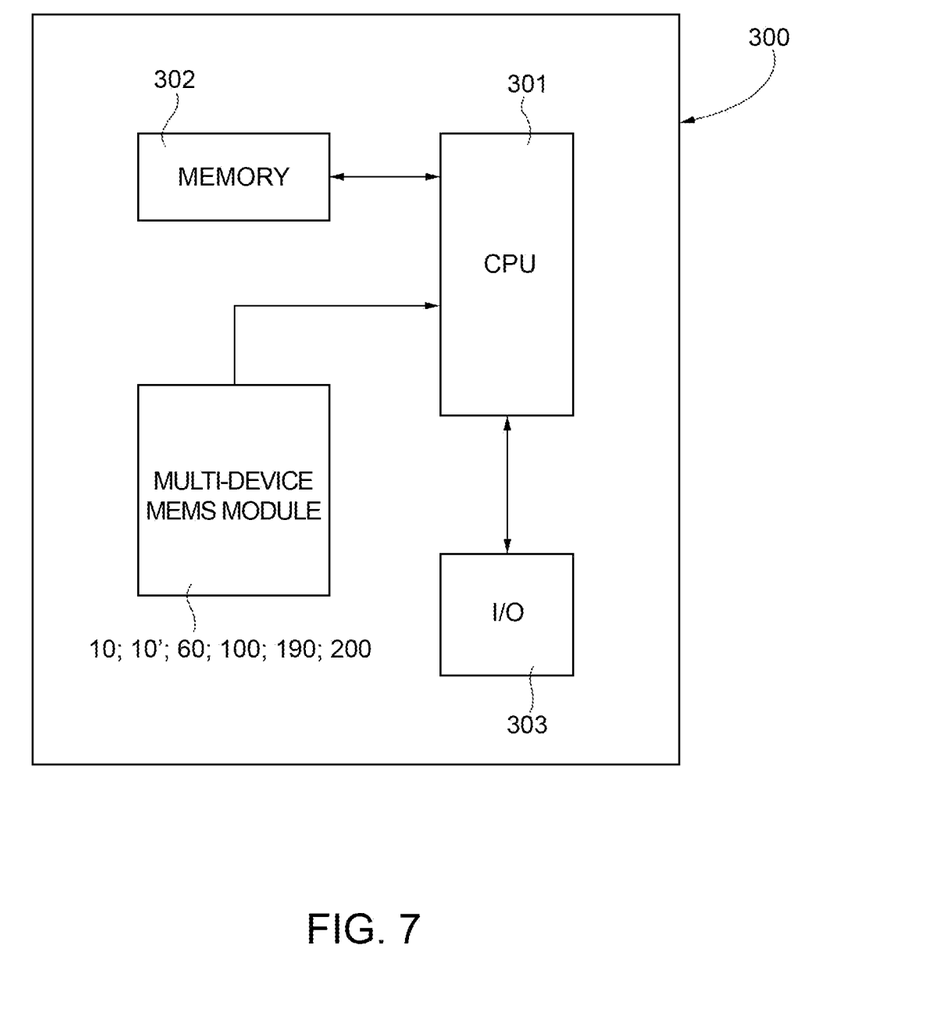
FIG. 7 is a schematic illustration of an electronic apparatus including a transducer module according to any one of the embodiments of FIGS. 1-5.

FIG. 7 shows an electronic device 300 that uses the transducer module according to any one of the embodiments described previously.

The electronic device 300 comprises, in addition to the multi-device module 10, 10', 60, 100, 190, 200 according to a respective embodiment described, a microprocessor (CPU) 301, a memory block 302, connected to the microprocessor 301, and an input/output interface 303, for example a keypad and/or a display, which is also connected to the microprocessor 301.

The multi-device module 10, 10', 60, 100, 190, 200 communicates with the microprocessor 301, and in particular transmits the electrical signals processed by the shared ASIC.

The electronic device 300 is, for example, a mobile communication device, such as a cellphone, a PDA, a notebook, but also a voice recorder, a reader of audio files with voice-recording capacity, a console for video-games, a hydrophone, etc.

The advantages of the disclosure described previously, according to the various embodiments, emerge clearly from the foregoing description.

In particular, the present disclosure provides a multi-device module that may be adapted to different configurations according to the specifications, at the same time reducing the costs and space in so far as some components (e.g., the ASIC 22') are shared.

Finally, it is clear that modifications and variations may be made to what has been described and illustrated herein, without thereby departing from the scope of the present disclosure.

The various embodiments described above can be combined to provide further embodiments. In particular, a different configuration of the MEMS acoustic transducer may be envisaged, specifically as regards the geometrical shape of the constituent elements. In the case where the space inside the package so allows, even a number of MEMS sensors or transducers may possibly be housed within a same package, each configured to detect a respective environmental quantity.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transducer module, comprising:
a supporting substrate having a first side and a second side, first and second through vias extending from the first side to the second side;
a conductive path at the second side of the supporting substrate, the conductive path coupled to the first and second through vias;
a cap coupled to the first side of the supporting substrate to form a first chamber and a second chamber, the second chamber being internally isolated from the first chamber, the first through via being in the supporting substrate at the first chamber, the second through via being in the supporting substrate at the second chamber;

a first sensor chip coupled to the first side of the supporting substrate in the first chamber, the first sensor chip integrating a first microelectromechanical (MEMS) transducer configured to detect a first environmental quantity and to generate a first transduced signal as a function of the first environmental quantity detected;

a second sensor chip coupled to the first side of the supporting substrate in the second chamber, the second sensor chip integrating a second microelectromechanical (MEMS) transducer configured to detect a second environmental quantity and to generate a second transduced signal as a function of the second environmental quantity detected; and a control chip in the first chamber, the control chip being functionally coupled to the first MEMS transducer, the control chip being functionally coupled to the second MEMS transducers by the first and second through vias and the conductive path.

2. The transducer module according to claim 1, wherein the cap has a partition wall that internally isolates the second chamber from the first chamber.

3. The transducer module according to claim 2, wherein the first and second chambers are delimited by respective regions of the substrate, the cap, and the partition wall.

4. The transducer module according to claim 1, wherein the supporting substrate includes dielectric layers of FR4 or interwoven glass fibers in an epoxy-resin matrix.

5. The transducer module according to claim 1, wherein the control chip is an application specific integrated circuit (ASIC).

6. The transducer module according to claim 1, wherein the first MEMS transducer and the second MEMS transducer are at least one of: an acoustic transducer, a pressure transducer, a light-radiation sensor, a UV sensor, an IR sensor, an acceleration sensor, or a gyroscope.

7. The transducer module according to claim 1, wherein the conductive path is covered by an insulating material.

8. A transducer module, comprising:
a supporting substrate having a first side and a second side, first and second through vias extending from the first side to the second side;
a conductive path in the supporting substrate, the conductive path coupled to the first and second through vias;
a cap coupled to the first side of the supporting substrate to form a first chamber and a second chamber, the second chamber being internally isolated from the first chamber, the first through via being in the supporting substrate at the first chamber, the second through via being in the supporting substrate at the second chamber;
a first sensor chip coupled to the first side of the supporting substrate in the first chamber, the first sensor chip integrating a first microelectromechanical (MEMS) transducer configured to detect a first environmental quantity and to generate a first transduced signal as a function of the first environmental quantity detected;
a second sensor chip coupled to the first side of the supporting substrate in the second chamber, the second sensor chip integrating a second microelectromechanical (MEMS) transducer configured to detect a second environmental quantity and to generate a second transduced signal as a function of the second environmental quantity detected; and a control chip in the first chamber, the control chip being functionally coupled to the first MEMS transducer, the control chip being functionally coupled to the second MEMS transducer by the first and second through vias and the conductive path.

9. The transducer module according to claim 8, wherein the substrate is a chip of semiconductor material.

10. The transducer module according to claim 8, wherein the cap includes a metal layer that forms an electromagnetic shield.

11. The transducer module according to claim 8, wherein the substrate includes first and second through openings, the first sensor chip in fluid communication with the first through opening and the second sensor chip in fluid communication with the second through opening.

12. The transducer module according to claim 8, wherein the control chip is coupled to the first MEMS transducer by first and second conductive wires, the first and second through vias, and the conductive path.

13. The transducer module according to claim 12, wherein the first conductive wire has a first end coupled to a contact at the first through via and a second end coupled to the control chip, wherein the second conductive wires has a first end coupled to the second MEMS transducer and a second end coupled to a contact at the second through via.

14. An electronic apparatus, comprising:
a microprocessor; and
a transducer module coupled to the microprocessor; the transducer module including:
a supporting substrate having a first side and a second side, first and second through vias extending from the first side to the second side;
a conductive path at the second side of the supporting substrate, the conductive path coupled to the first and second through vias;
a cap coupled to the first side of the supporting substrate to form a first chamber and a second chamber, the second chamber being internally isolated from the first chamber, the first through via being in the supporting substrate at the first chamber, the second through via being in the supporting substrate at the second chamber;
a first sensor chip coupled to the first side of the supporting substrate in the first chamber, the first sensor chip integrating a first microelectromechanical (MEMS) transducer configured to detect a first environmental quantity and to generate a first transduced signal as a function of the first environmental quantity detected;
a second sensor chip coupled to the first side of the supporting substrate in the second chamber, the second sensor chip integrating a second microelectromechanical (MEMS) transducer configured to detect a second environmental quantity and to generate a second transduced signal as a function of the second environmental quantity detected; and
a control chip in the first chamber, the control chip being functionally coupled to the first MEMS transducer, the control chip being functionally coupled to the second MEMS transducers by the first and second through vias and the conductive path.

15. The electronic apparatus according to claim 14, wherein the cap or the supporting substrate includes a first through opening in fluid communication with the first sensor chip, wherein the cap or the supporting substrate includes a second opening in fluid communication with the second sensor chip.

16. The electronic apparatus according to claim 14, wherein the environmental quantity to be detected by the first sensor chip is an acoustic wave, wherein the second environmental quantity to be detected by the second sensor chip is an acoustic wave, UV radiation, IR radiation, visible light, or an ambient pressure.

17. The electronic apparatus according to claim 14, wherein the cap includes a metal layer that forms an electromagnetic shield.

18. The electronic apparatus according to claim 14, wherein the conductive path is covered by an insulating material.

19. The electronic apparatus according to claim 14, wherein the electronic apparatus is at least one of: a cellphone, a PDA, a notebook, a voice recorder, an audio reader with voice-recording functions, a console for video games, or a hydrophone.

\* \* \* \* \*